United States Patent [19]

Maurer

[11] Patent Number: 5,856,933
[45] Date of Patent: Jan. 5, 1999

[54] SYSTEM AND METHOD FOR DIGITAL SIMULATION OF AN ELECTRICAL CIRCUIT

[75] Inventor: Peter M. Maurer, Tampa, Fla.

[73] Assignee: University of South Florida, Tampa, Fla.

[21] Appl. No.: 847,865

[22] Filed: Apr. 28, 1997

Related U.S. Application Data

[63] Continuation of Ser. No. 253,733, Jun. 3, 1994, abandoned.

[51] Int. Cl.⁶ .............................. G06F 9/455; G06F 17/50
[52] U.S. Cl. ............................................................ 364/578
[58] Field of Search ............................ 395/500; 364/578, 364/488–491

[56] References Cited

U.S. PATENT DOCUMENTS

| 4,527,249 | 7/1985  | Van Brunt ........................... 364/578 |
| 4,751,637 | 6/1988  | Catlin . |
| 4,782,440 | 11/1988 | Nomizu et al. ........................ 395/500 |
| 4,814,983 | 3/1989  | Catlin . |
| 4,827,427 | 5/1989  | Hyduke ................................. 364/489 |
| 4,916,647 | 4/1990  | Catlin ................................... 364/578 |
| 4,960,724 | 10/1990 | Watanabe et al. ..................... 437/51 |
| 4,982,361 | 1/1991  | Miyaoka et al. ...................... 395/500 |
| 5,062,067 | 10/1991 | Schaefer et al. ...................... 364/578 |
| 5,097,422 | 3/1992  | Corbin, II et al. ................... 364/491 |
| 5,125,098 | 6/1992  | Burrows ................................ 395/800 |
| 5,189,629 | 2/1993  | Kohnen ................................. 364/490 |
| 5,267,175 | 11/1993 | Hooper .................................. 364/489 |
| 5,272,651 | 12/1993 | Bush et al. ............................ 364/578 |
| 5,305,229 | 4/1994  | Dhar ..................................... 364/489 |
| 5,410,673 | 4/1995  | Oguri .................................... 395/500 |
| 5,426,768 | 6/1995  | Kanazawa ............................. 395/500 |

OTHER PUBLICATIONS

Proceedings of the 27th ACM/IEEE Design Automation Conference, 1990, Zhicheng Wang and Peter M. Maurer, "Lecsim: A Levelized Event Driven Compiled Logic Simulator", pp. 491–496.

Primary Examiner—Vincent N. Trans
Assistant Examiner—Ayni Mohamed
Attorney, Agent, or Firm—Sean T. Moorhead; Calfee, Halter & Griswold LLP

[57] ABSTRACT

A system for digital simulation of an electric circuit is disclosed. The system is event-driven, and functions on a gate inversion principle, to simulate an electric circuit. According to the gate inversion principle, any gates or gate arrangements in the circuit for which the input does not change are not simulated. A machine readable circuit description is generated which includes the gates and the gate arrangements for the circuit. Translation means creates data structures suitable for simulation of the circuit. Simulation means creates a program which schedules the simulation of only those gates or gate arrangements whose outputs change value during the simulation. According to the preferred embodiment, the simulation means uses only inversions of signals from individual gates or gate arrangements to perform the simulation of the circuit. Furthermore, the translation means includes means for removing any NOT gates from the circuit, and means for collapsing all homogeneous connections in the circuit. According to a further aspect of the invention, the translation means can include means for collapsing some heterogeneous connections in the circuit.

15 Claims, 6 Drawing Sheets

| NEXT SHADOW |
|---|
| PREVIOUS SHADOW |
| SUBROUTINE |
| FIRST FANOUT BRANCH |
| LAST FANOUT BRANCH |
| QUEUE ADDRESS |
| LOCK ADDRESS |

SYSTEM AND METHOD FOR DIGITAL SIMULATION OF AN ELECTRICAL CIRCUIT

This is a continuation of application Ser. No. 08/253,733, filed on Jun. 3, 1994, now abandoned.

TECHNICAL FIELD

The present invention relates to digital simulation of an electrical circuit, and particularly to an event driven system for digital simulation of an electrical circuit.

BACKGROUND

In the applicant's experience, there are two basic techniques for improving the performance of digital simulation. One technique seeks to improve the performance of gate simulations; the other seeks to reduce the number of gate simulations performed. Until now, these two techniques have worked at cross-purposes to one another. Techniques that use complex scheduling techniques to reduce the number of gate simulations require large amounts of time per gate simulation. Techniques which improve the speed of gate simulations by reducing or eliminating scheduling code simulate more gates than necessary. In the past several years there has been much research in improving simulation performance. Two basic approaches to simulation have evolved, which are termed Oblivious and Event-Driven. Oblivious simulators eliminate scheduling code to improve the performance of gate simulations, but provide no performance improvements for circuits that require few gate simulations. Event-Driven simulators use scheduling techniques to reduce the number of gates simulated, but perform poorly when the number of gate simulations is large.

Figure 1:
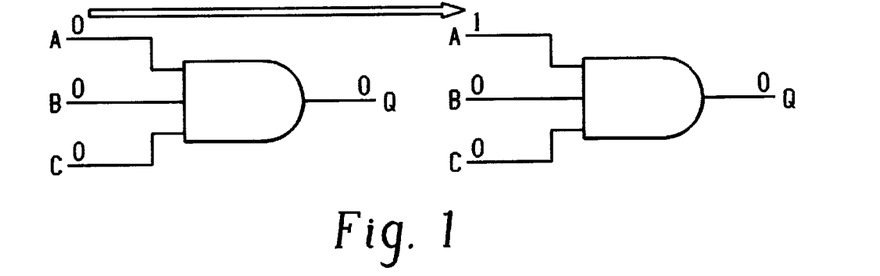
FIG. 1 is a schematic illustration of a gate arrangement which results in a useless simulation.
Figure 2:
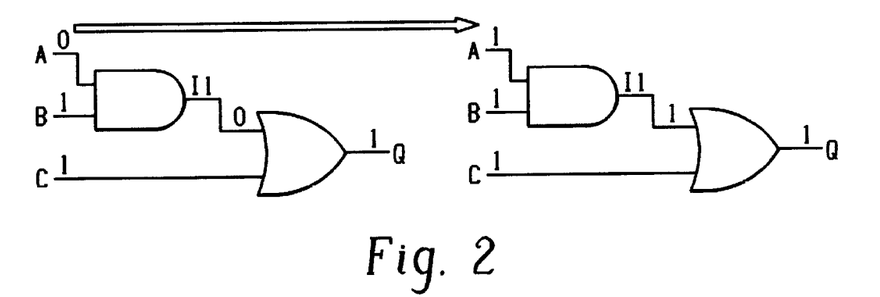
FIG. 2 is a schematic illustration of a gate arrangement resulting in an unpropagated change.

Although traditional event-driven simulation eliminates a significant number of gate simulations, it does not eliminate all useless gate simulations. A gate simulation can be considered useless if it does not produce a change in any monitored net (i.e. a net whose value is visible to the user). In traditional event-driven simulation, a gate is simulated if and only if its inputs change value. There is a non-traditional approach to event-driven simulation which differs significantly from the usual event driven technique. With the non-traditional approach, if the inputs of a gate change, this change may not propagate to a monitored net. This can occur in two ways. First, when the gate is simulated, the output may not change. Consider, for example, the gate AND pictured in FIG. 1. Since all three inputs are zero, the change from zero to one in net A will not cause a change in net Q. The simulation of this AND gate could be eliminated without affecting the results of the simulation. The second way that a gate simulation could fail to affect a monitored net is for the output of the gate to change, but the change to be "absorbed" by some other gate before reaching the monitored net. This situation is illustrated in FIG. 2.

SUMMARY OF THE PRESENT INVENTION

The system of the present invention was developed to reduce the number of useless gate simulations performed during the course of an event driven digital simulation. The system focuses on reducing the useless simulations of the first kind, those gate simulations that do not result in a change in the output of the gate. Eliminating useless simulations of the second kind is a significantly more difficult problem, which is currently under study.

The system of the present invention is event-driven, and functions on a gate inversion principle to simulate an electric circuit. According to the gate inversion principle, any gates or gate arrangements in the circuit for which the input does not change are not simulated. A machine readable circuit description is generated which includes the gates and the gate arrangement for the circuit. A translation means creates data structures suitable for simulation of the circuit. A simulation means creates a program which schedules the simulation of only those gates or gate arrangements whose outputs change value during the simulation. According to the preferred embodiment, the simulation means uses only inversions of signals from individual gates or gate arrangements to perform the simulation of the circuit. Furthermore, the translation means includes means for removing any NOT gates from the circuit, and means for collapsing all homogeneous connections in the circuit. According to a further aspect of the invention, the translation means can include means for collapsing some heterogeneous connections in the circuit.

Further features of the present invention will become further apparent from the following detailed description and the accompanying drawings.

DETAILED DESCRIPTION OF THE PREFERRED EMBODIMENT

As described above, a simulator according to the present invention is event-driven, and functions on a gate inversion principle to simulate an electric circuit. According to the gate inversion principle, any gates or gate arrangements in the circuit for which the input does not change are not simulated. A machine readable circuit description is generated which includes the gates and the gate arrangement for the circuit. A translation means creates data structures suitable for simulation of the circuit. A simulation means creates a program which schedules the simulation of only those gates or gate arrangements whose outputs change value during the simulation. According to the preferred embodiment, the simulation means uses only inversions of signals from individual gates or gate arrangements to perform the simulation of the circuit. Furthermore, the translation means includes means for removing any NOT gates from the circuit, and means for collapsing all homogeneous connections in the circuit. According to a further aspect of the invention, the translation means can include means for collapsing some heterogeneous connections in the circuit.

Figure 7:
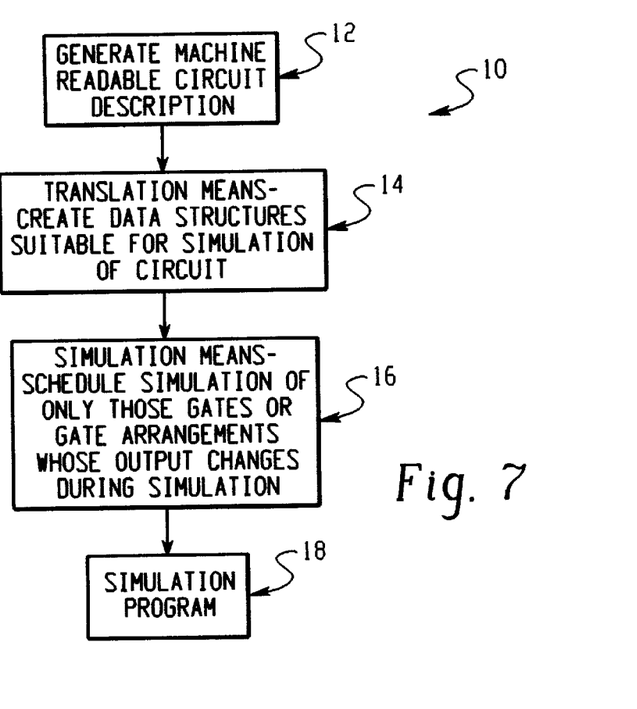
FIG. 7 is a schematic illustration of the technique for simulating an electrical circuit, according to the principles of the present invention.

Referring to FIG. 7, the manner in which a simulator according to present invention is implemented is shown at 10. A machine readable circuit description is generated, which includes the gates and gate arrangements for the circuit (see step 12). A translation means 14 is provided, which creates data structures suitable for simulation of the circuit. A simulation means 16 creates a program 18 which schedules the simulation of only those gates or gate arrangements whose outputs change value during the simulation.

The underlying principle of the present invention is that no gate will be scheduled for simulation unless its output is guaranteed to change value. When the simulator of the present invention processes an event on a gate-input, it must perform tests to determine whether the output of the gate will change. The present invention provides tests which are individualized for different gate-types, but one of the consequences of never simulating a gate unless its output changes is that different gate-types may appear to be identical during simulation. (For example, the present invention treats AND and NAND gates identically.)

The current implementation of a simulator according to the present invention supports the 8 gate types AND, NAND, OR, NOR, XOR, XNOR, NOT, and BUFFER. These gate-types can be used as building blocks to construct more complex gate-types. The tests for the XOR, XNOR, NOT, and BUFFER gates are designed such that any change in an input of one of these gates implies a change in the output. Therefore it is possible to schedule the gate for simulation whenever one of its inputs changes. For XOR and XNOR gates the simulation can be optimized further by testing to see whether the gate is already scheduled for simulation. When this is the case, the two simulations will cancel each other leaving the output unchanged. Therefore both simulations can be eliminated When processing an event for an input to an XOR or XNOR gate, the system of the present invention first checks to see whether the gate is scheduled for simulation, and deschedules it if it is already in the queue. In all other cases, the gates of type XOR, XNOR, NOT, and BUFFER are scheduled unconditionally whenever one of their inputs changes value.

The tests for AND, OR, NAND and NOR are more complex and are based on a counting algorithm which operates as follows. This algorithm assumes that there has been a change in an input X to the gate G. The dominant value is 1 for OR and NOR gates, and 0 for AND and NAND gates.

```
begin
    Count.of.G := Count.of.G + 1;
    if Count.of.G = 1 then
        Output.of.G := Dominant.Value.of.G;
    endif;
end
else
begin
    Count.of.G := Count.of.G - 1;
    if Count.of.G = 0 then
        Output.of.G := NOT Dominant.Value.of.G;
    endif;
endif;
```

Note that the counting algorithm assigns a value to the output of G only if the output changes value. This algorithm is extremely efficient because it uses the value of a single input and a count rather than using all input values to compute the output. The technique of the present invention uses an optimized form of the counting algorithm to determine whether the output of an AND, NAND, OR, or NOR gate will change.

As with XOR and XNOR gates, it is possible for more than one input of an AND, NAND, OR, or NOR to change simultaneously. When this occurs, it is also possible for two simultaneous changes to occur in the output of the gate. As with XOR and XNOR gates, these two successive changes will cancel one another. When a future change is detected in one of these gates, it will be scheduled for simulation only if it has not already been scheduled for simulation. If it has already been scheduled, it will be descheduled instead.

It should be noted that, unlike traditional event-driven simulation, the counting algorithm is used during the event processing phase of the simulator rather than the gate simulation phase. Although modifying and testing counts increases the amount of work that must be done during event processing, the amount of work required during the gate simulation phase is minimal. It is not necessary to test the output of a gate to determine whether an event has occurred, because no gate is simulated unless its output is guaranteed to change. Furthermore, since any time a gate is simulated, its output is changed either from one to zero or from zero to one, the only operation required to simulate a gate is the inversion operation.

Surprisingly, it is possible to eliminate most gate simulations entirely. The correct operation of the present invention does not require net-values. Therefore, it is possible to eliminate all net values and the associated simulations, except when the net-value is visible to the user. To schedule XOR, XNOR, NOT, and BUFFER gates, it is not necessary to know the value of the inputs. The only information that is required is that an input has changed value. The input values for AND, NAND, OR and NOR gates are also unnecessary. The counting algorithm increments the gate count when a net value changes from the non-dominant value to the dominant value, and decrements the gate count when the reverse change occurs. Because a net is processed only when its value changes, and because the value of each input alternates between the dominant and the non-dominant value, the only information for correct processing of AND, NAND, OR, and NOR inputs, is whether the next counting operation is an increment or a decrement. Because this can be done in a way that does not require testing, the counting technique used by the present invention is even more efficient than that illustrated above.

Testing of dominant values can be eliminated because the Shadow Technique is used as the underlying implementation of the present invention. In the Shadow Technique, each event is represented by a structure similar to that illustrated in FIG. 3.

Figure 3:
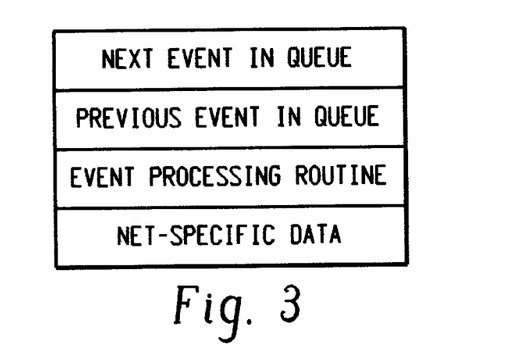
FIG. 3 is schematic description of an event structure for a simulation system according to the present invention.

FIG. 3. An Event Structure

The Event Processing Routine illustrated in FIG. 3 is a pointer to the code to be executed to process the event. For AND and OR gates, two event-processors are created, one that increments the count, and another which decrements the count. The Event Processing Routine field of the event structure is altered by these routines, so that it always points to the correct processor. When the increment processor executes, it stores the address of the decrement processor in this field, and when the decrement processor executes, it stores the address of the increment processor. Thus the routines will alternate with one another for a particular net, and no tests are necessary to determine which processor to execute next.

The elimination of net values has some surprising consequences. First, since the simulator does not need to keep track of the value of gate outputs, the processing for AND and NAND gates is identical, as is the processing of OR and NOR gates, XOR and XNOR gates, and NOT and BUFFER gates. The presence of an inverted output can simply be ignored. Because the increment and decrement operations performed for AND and OR gates are with respect to the dominant value of the gate, the processing for these two gates is identical once net-values are eliminated. The only gate simulations that must be retained are those for nets visible to the user, and other than the printing of output values, these simulations have no effect on the simulation. Therefore, those few inversion operations that are required can be performed in the event-processing phase of the simulator of the present invention, eliminating the need for a separate gate-simulation phase.

Figure 4:
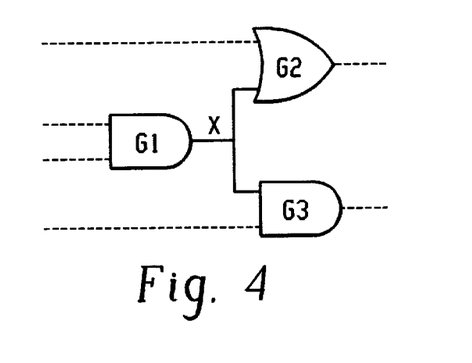
FIG. 4 is a schematic illustration of a circuit fragment which is useful in illustrating the principles of the present invention.

In a sense, the simulator of the present invention performs no traditional gate evaluations, but simply processes a series of events. These events differ in one important way from the events processed by traditional event-driven algorithms. In traditional event-driven simulation, each event corresponds to a change in a single net. However, in the present invention each event corresponds to a change in a single fanout branch of a net. Thus a single event in a traditional event-driven algorithm may correspond to several events in the simulator of the present invention. FIG. 4 illustrates why this is necessary.

FIG. 4. A Circuit Fragment

In FIG. 4, the output of gate G1, signal X, is the input signal for two additional gates G2 and G3. However, the inputs of G2 and the inputs of G3 require different sorts of processing. When an increment operation is performed for G2, a decrement operation must be performed for G3, and vice-versa. Although both of these events could be performed during the processing of a single event, it is more convenient to incorporate them into separate events. Thus, the units of scheduling in the simulator of present invention are fanout branches. This implementation style also facilitates the incorporation of inversion events for computing the values of monitored nets. In FIG. 4, if net X were a monitored net, the simulator would add a third fanout branch to compute the value of X.

Because the simulator of the present invention computes only changes in signals, it is necessary to assign each signal a value before simulation begins. It is necessary that the assignment of values be consistent with the structure of the circuit. For example, it is necessary that the input and output of a NOT gate have the opposite value. This is necessary because the determination of the initial operation for AND, NAND, OR and NOR fanout branches, and the initial value of gate-counts requires initialization values to be consistent. The computation of the initialization values does not depend on any particular timing model, so this can be done by performing an interpretive zero-delay simulation immediately after parsing the circuit. This operation needs to be performed only once during the lifetime of the circuit.

1. Details of the Translation Phase

A system according to the present invention has two major phases, the Translation Phase (see 14, FIG. 7) which prepares the circuit for simulation, and the Simulation Phase (see 16, FIG. 7) which performs the simulation. The primary function of the Translation Phase is to prepare the data structures used by the Simulation Phase. (The current implementations of the present invention also generate the run-time code, but this is unnecessary because this code could just as easily be loaded from a library of precompiled routines.)

The first step in the translation phase is to parse the circuit description, and translate it into internal data structures. Once this has been done, the circuit is levelized, the gates of the circuit are sorted into levelized order, and each gate is simulated once to generate a set of consistent values. (For asynchronous cyclic circuits, two or more simulation passes may be required.) Next, a SIMULATION fanout branch is added to each monitored net. Finally a data structure known as a shadow is generated for each fanout branch of each net in the circuit.

Figure 5:
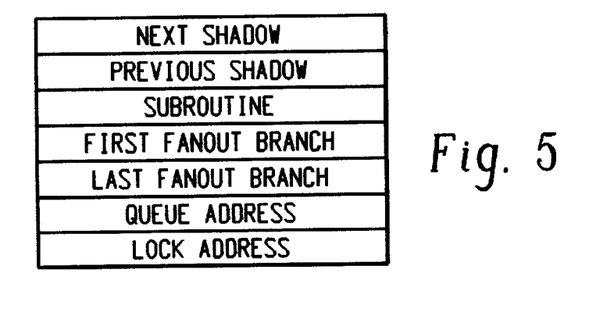
FIG. 5 is a schematic description of the structure of a shadow for a simulation system according to the present invention.

FIG. 5 illustrates the structure of a shadow. The next and previous shadow fields are used to link the shadow into the event list. The event list is doubly linked to facilitate fast dequeing of events. The subroutine field points to the event processing routine for this fanout branch. The first and last fanout branch fields contain pointers to the first and last shadow that will be scheduled when the output of the gate associated with this shadow changes value. Because all fanout branches of a net must be scheduled or descheduled simultaneously, the shadows corresponding to these fanout branches are statically linked together during the translation phase. This subchain of shadows will be inserted as a group into the event list. The first and last fanout branch pointers allow provide the event processing routines with access to the previous pointer of the first shadow and the next pointer of the last shadow. The lock address field contains the address of the counter for the gate associated with the fanout branch. For NOT, BUFFER, XOR and XNOR gates, this field is unused. Finally, the queue address is the address of the head of the queue into which the shadow is to be inserted.

FIG. 5. The Structure of a Shadow

Eight different event processors are used during the simulation phase of the present invention. These occur in pairs and are called INCREMENT, INCREMENTX, DECREMENT, DECREMENTX, NOT, NOTX, XOR and XORX. For each pair, the first routine is used for nets that are not at the end of a subchain corresponding to a specific net, while the second is used only for those shadows that are at the end of their respective subchain. For each pair, the two subroutines are identical, except for removing the subchain from the event list, which is done by the second routine. Creating these routines in pairs allows this operation to be performed unconditionally. The NOT processors are used for NOT and BUFFER gates, while the XOR processors are used for XOR and XNOR gates. Depending on the optimizations applied during the translation phase, these routines may or may not be used at run time. The NOT and XOR processors are identical, except that the XOR processor may either queue or dequeue events. Because NOT and BUFFER gates have only a single input, the test to determine whether the fanout branches have already been queued is unnecessary.

The INCREMENT and DECREMENT processors are used for AND, NAND, OR, and NOR gates. If the initialization value of an AND or a NAND input branch is zero, then the decrement processor is used, otherwise the increment processor is used. Similarly, if the initialization value of an OR or a NOR gate is one, then the increment processor is used, otherwise the decrement processor is used. A gate-count is generated for each AND, NAND, OR and NOR gate. The initial value of the gate count is computed by counting the dominant values of the inputs of the gate.

2. Details of the Simulation Phase

Most existing implementations of the present invention are based on the LECSIM simulator developed by Wang and Maurer and described in a paper of Z. Wang and P. M. Maurer, "LECSIM: A Levelized Event Driven Compiled Logic Simulator," Proceedings of the 27th Design Automation Conference, 1990, pp. 491–496 (see Attachment A hereto). LECSIM is a zero-delay event-driven levelized compiled code simulator. In the LECSIM simulator, gates are levelized and the number of levels is counted, including the zero level which corresponds to the primary inputs of the circuit. One queue is created for each level in the circuit. When a gate is queued for simulation, it is placed in the queue that corresponds to its level. Queues are processed in order by level. For asynchronous cyclic circuits, queues may be processed more than once.

Figure 6:
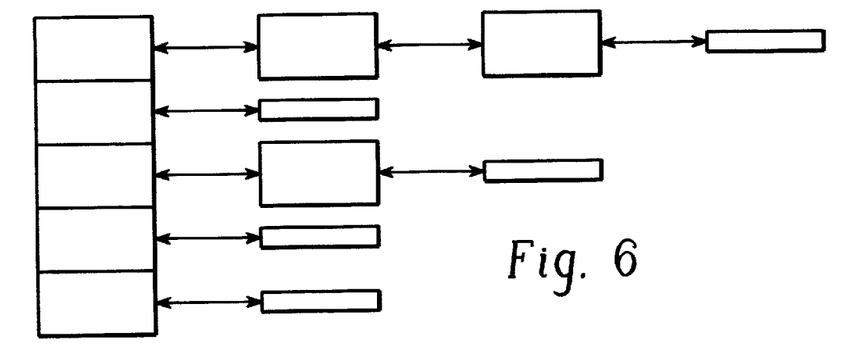
FIG. 6 is a schematic illustration of the structure of the simulation queue for a simulation system according to the present invention.

Like LECSIM, the system of the present invention levelizes the circuit and creates one event queue per level in the circuit, including the zero level. Each queue consists of a doubly linked list of shadows terminated by a special shadow known as the queue-trailer. The queue-trailer is responsible for advancing the simulation from one queue to the next and for terminating the simulation when appropriate. FIG. 6 illustrates the structure of the run-time queue. As this figure illustrates, the queue headers are organized as an array of pointers, each of which points to a doubly linked list of shadows.

FIG. 6. The Structure of the Simulation Queue

During the simulation phase, the simulator reads consecutive input vectors and simulates each one. The simulation of an input vector begins with the primary input tests. The value of each primary input is compared with the value from the previous vector (or with zero for the first vector) and if there is a change, the fanout branches of the primary input are queued in event queue zero. Once all primary inputs have been tested, the simulator loads the address of the first shadow in queue zero into the current-shadow register and branches to the subroutine address contained in the shadow. When an event is processed, additional shadows may be inserted into other queues. Once the last queue has been processed, simulation of the current vector terminates and a new vector (if any) is read. Prior to reading the new vector, the value of each monitored net is printed.

The code for the INCREMENTX routine is described below:

```
INCREMENTX:
    /* Alternate the INC & DEC processors */
    Current_Shadow—>subroutine = &DECREMENTX;
    (*Current_Shadow—>Lock)++;
    /* If a change in the output will occur */
    if ((*Current_Shadow—>Lock) == 1)
    {
        /* If the gate is not already queued */
        if (Current_Shadow—>first_fanout—>next == NULL)
        {
            /* queue the gate for simulation */
            Current_Shadow—>last_fanout—>next =
                Current_Shadow—>Queue—>next;
            Current_Shadow—>Queue—>next—>previous =
                Current_Shadow—>last_fanout;
            Current_Shadow—>Queue—>next =
                Current_Shadow—>first_fanout;
            Current_Shadow—>first_fanout—>previous =
                Current_Shadow—>Queue;
        }
        else
        {
            /* dequeue the gate */
            Current_Shadow—>last_fanout—>next—>previous =
                Current_Shadow—>first_fanout—>previous;
            Current_Shadow—>first_fanout—>previous—>next =
                Current_Shadow—>last_fanout—>next;
            Current_Shadow—>last_fanout—>next = NULL;
        }
    }
    Temp = Current_Shadow—>next;
    Current_Shadow—>next = NULL;
    Current_Shadow = Temp;
    Goto *Current_Shadow—>subroutine;
```

As seen from the foregoing, relatively little run-time code is required by a system according to the present invention.

3. Optimizations of the Present Invention

There are several simple optimizations that can be used to significantly increase the performance of a system according to the present invention. The most important of these are block scheduling of fanout branches, the elimination of NOT and BUFFER gates, the elimination of XOR and XNOR gates, collapsing homogeneous connections, and collapsing heterogeneous connections. Block scheduling of fanout branches has already been described. This optimization allows all fanout branches of a net to be scheduled as a group rather than individually.

Figure 8A:
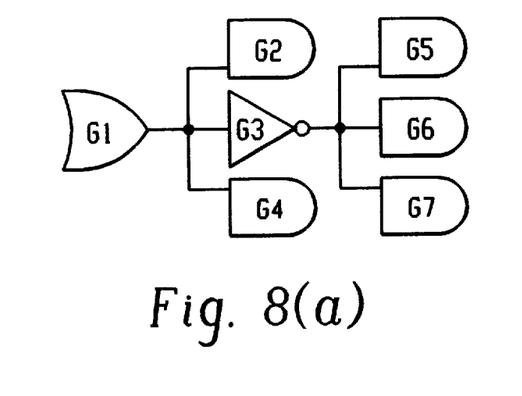
FIGS. 8(a) and 8(b) are schematic illustrations of circuit before and after elimination of a NOT gate.
Figure 8B:
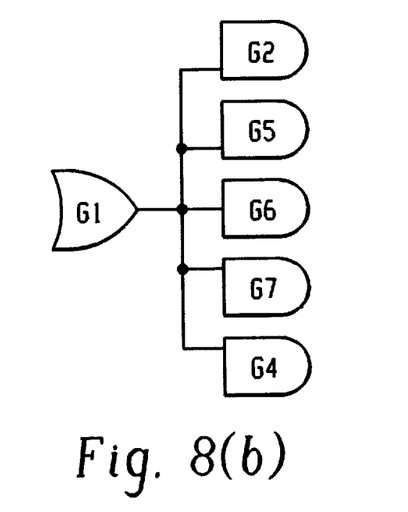

It is possible to eliminate all NOT and BUFFER gates from a simulation, according to the principles of the present invention. When the input of a NOT or BUFFER gate is processed, the only action that is taken is scheduling the fanout branches of the output of the gate. The same effect can be achieved by simply not scheduling the input of the gate, but scheduling its fanout branches instead. FIG. 8 illustrates this procedure. It is necessary to retain the NOT and BUFFER gates during the generation of consistent initial values for all signals. Once this operation is complete, the translation phase may simply ignore all NOT and BUFFER gates. For the Unit-Delay and Multi-Delay timing models, special procedures may be required to preserve the delay of the gate while eliminating its logical function.

FIG. 8. The elimination of a NOT gate

Just as it is possible to ignore all NOT and BUFFER gates, it is also possible to eliminate all XOR and XNOR gates. Again, the only action taken when processing an input to one of these gates is to schedule or deschedule the fanout branches of the gate. One can eliminate the processing of the input branch by scheduling or descheduling the output branches of the gate instead. This can interfere with block scheduling of fanout branches as FIG. 9 illustrates.

Figure 9:
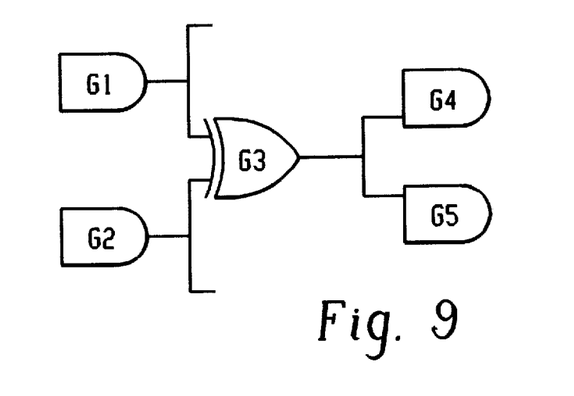
FIG. 9 is a schematic illustration of a circuit fragment illustrating the elimination of XOR gates.

FIG. 9. The Elimination of XOR Gates

Suppose that gate G3 of FIG. 9 has been eliminated, and suppose further that the outputs of G1 and G2 have both changed. When the output signal of gate G1 is processed, it will be necessary to schedule the fanout branches of G3 and the fanout branches of G1 that are not inputs to G3. When the output signal of gate G2 is processed, it will be necessary to deschedule the fanout branches of G3, and schedule the fanout branches of G2 that are not inputs to G3. Thus, the fanout branches of G3 must maintain their identity, and cannot be grouped with the fanout branches of G1 and G2. Due to this conflict, and the relative rarity of XOR and XNOR gates, this optimization may not need to be implemented in a simulator using the principles of the present invention.

Figure 10:
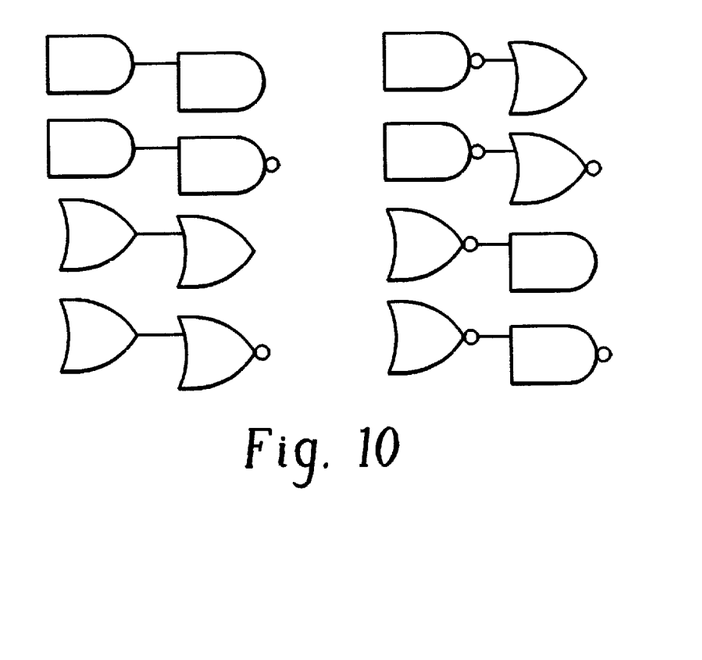
FIGS. 10 and 11 are schematic illustrations of homogeneous and heterogeneous connections in a digital circuit.
Figure 11:
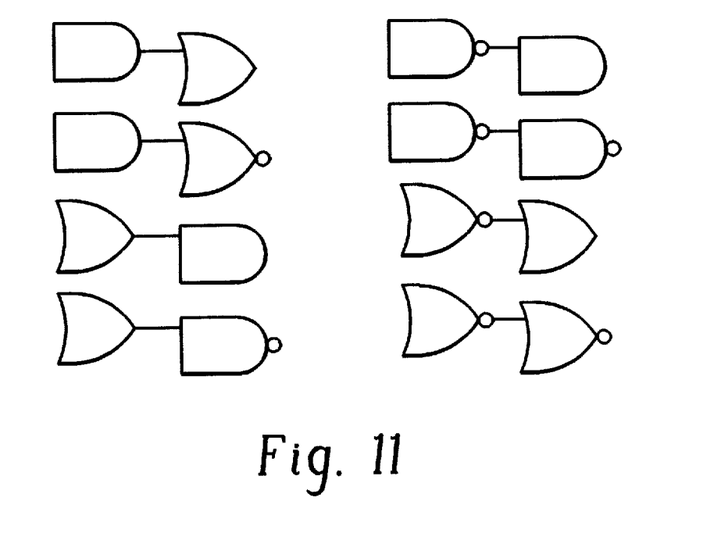

It is possible to eliminate much of the processing for other types of nets in the circuit. Assume for the moment that all NOT and XOR gates have been eliminated from the circuit. This leaves only AND, NAND, OR, and NOR gates. To clarify the procedures for eliminating connections between these gates it is necessary to distinguish between two types of connections, Heterogeneous connections and Homogeneous connections. Each connection between AND, NAND, OR, and NOR gates can be classified as one or the other, but this classification must be performed before the NOT gates have been eliminated from the circuit. (To simplify this discussion, assume that the circuit contains no XOR or XNOR gates.) FIG. 10 illustrates all possible homogeneous connections, while FIG. 11 illustrates all possible heterogeneous connections.

A direct connection between two AND gates is an example of a homogeneous connection. If a NOT gate were placed between the two AND gates, this would transform the connection into a heterogeneous connection. The general rule is that an intervening NOT gate transforms a homogeneous connection into a heterogeneous connection, and vice versa. As is usually the case, two consecutive NOT gates cancel one another.

Figure 12:
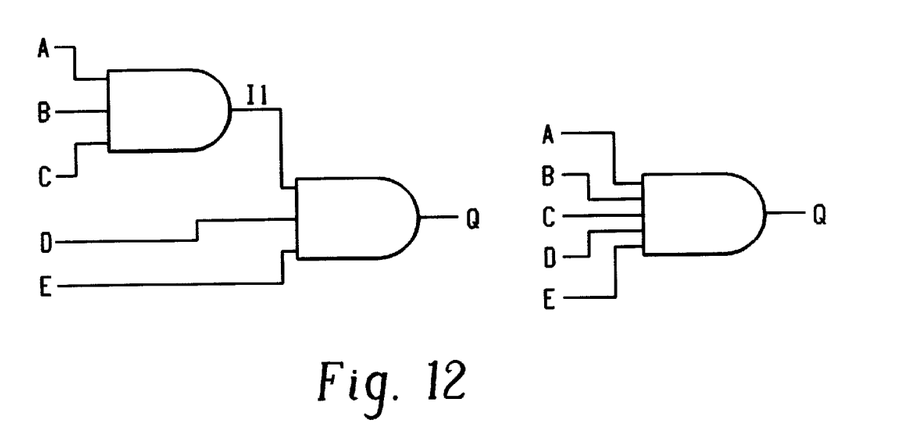
FIG. 12 schematically the elimination of a homogeneous connection, according to the present invention.

It is possible to eliminate all homogeneous connections from a circuit, however it is not always advantageous to do so. If a net fans out to more than one gate, then none of its connections should be eliminated. It is always advantageous to eliminate homogeneous connections for nets that do not fan out. FIG. 12 illustrates the elimination of a homogeneous connection. To eliminate the connection 11, one simply removes gate G1, and treats the inputs A, B, and C as if they were inputs of G2. The initial value of the gate count of G2 is recomputed by adding the initial gate-counts of G1 and G2 and subtracting one.

FIG. 12. Eliminating a Homogeneous Connection

Note that it is possible to eliminate some homogeneous connections in a conventional simulator. In particular AND-AND and OR-OR connections can be eliminated by treating the combination of gates as a single AND or a single OR gate. The simulator of the present invention permits NAND-OR and NOR-AND connections to be eliminated without restructuring the circuit. (The procedure for eliminating these types of connections is essentially identical to that for eliminating AND-AND connections.)

It is also possible to eliminate some or all of the heterogeneous connections in a circuit, however the procedure is more complex and does not always completely eliminate all the operations required to simulate these connections. (As with homogeneous connections, it is advantageous to eliminate a homogeneous connections only for those nets that do not fan out.) There are two procedures for eliminating heterogeneous connections, which are called the linear method, and the layered method. Current implementations of the simulator of the present invention use only the layered method, because this technique eliminates more connections than the linear method. On the other hand, the linear method completely eliminates connections, while the layered method requires the retention of certain operations.

Figure 13:
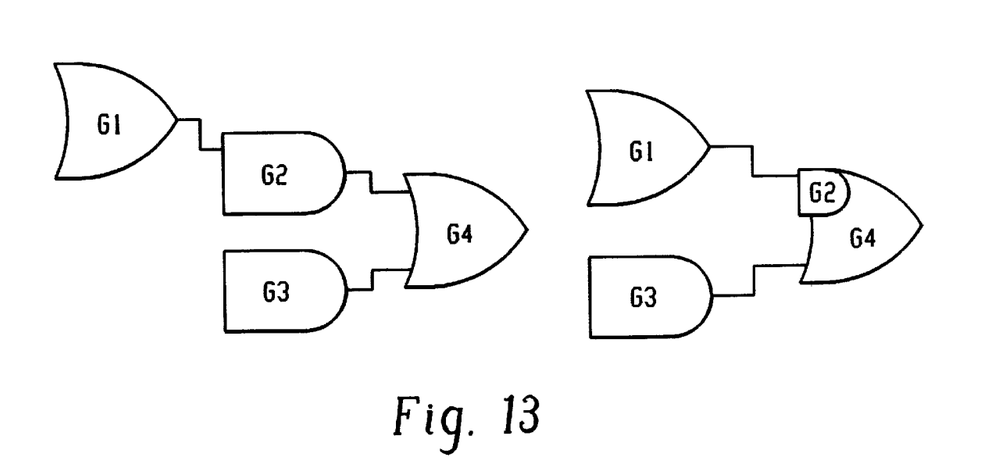
FIG. 13 schematically illustrates the elimination of a heterogeneous connection, according to the principles of the present invention.

In the linear method, it is possible to eliminate only one input from any gate. FIG. 13 illustrates this point.

FIG. 13. Eliminating a Heterogeneous Connection

In FIG. 13, it is possible to collapse either G2 or G3 into G4. However, once G2 has been collapsed into G4, it is no longer possible to collapse G3 into G4. It is, however, possible to collapse G1 into G2, and then collapse the G1/G2 combination into G4. In other words, gates must be collapsed in linear fashion.

In an unoptimized version of a simulator according to the present invention, gate-counts are either incremented by 1 or decremented by 1. When using the Linear Method different values are used to increment and decrement the gate-count. Consider the collapsed gate illustrated in FIG. 14.

Figure 14:
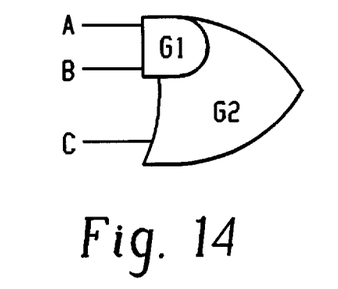
FIG. 14 is a schematic illustration of a collapsed AND-OR connection, in a system according to the principles of the present invention.

FIG. 14. A Collapsed AND-OR Connection

In FIG. 14, a single count will be maintained for the combined gate G1/G2. Suppose that all three inputs, A, B, and C, have the value 0, which would force the gate-count of G1/G2 to be zero. For the gate G1/G2 to change, it is necessary for C to change or for both A and B to change. The total effect of both changes in A and B must equal the effect that G1 would have had in the original circuit, and must equal the effect that C has on the collapsed gate. Furthermore, neither A nor B by itself can have enough effect on the gate count to cause the output of G1/G2 to change. Because of the symmetry of the circuit, the effect of A and B should be the same. To achieve these requirements, the input C is assigned the value 1, and the inputs A and B are assigned the value 0.5. When the gate count of G1/G2 changes from a value that is less than one to a value that is greater than or equal to one (or vice-versa) then the output of G1/G2 will change.

Figure 15:
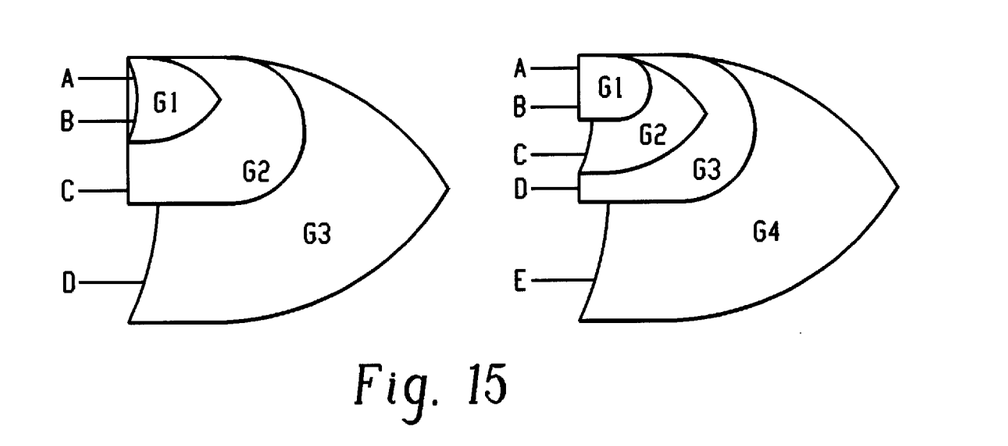
FIG. 15 is a schematic illustration of multi-level collapsed connections, for a simulation system according to the present invention.

Three-level collapsed connections follow the same principles as two-level collapsed connections. Values are assigned to inputs depending on their relative power to change the output of the collapsed gate. FIG. 15 illustrates a three-level, and a four-level collapsed gate.

FIG. 15. Multi-Level Collapsed Connections

For collapsed gates, there are several effective methods of assigning values to inputs and gate-counts. The procedure used for the two gates illustrated in FIG. 15 is an acceptable method which can easily be extended to arbitrarily deep connections. The values for the gate G1/G2/G3 are calculated in the following manner. Assume that A, B, C, and D have been initialized with the logic value of 0. The increment of D is set to 1. The total effect of the G1/G2 combination must be equal to the effect of D. Since A and B are symmetric inputs, the increments assigned to A and B should be equal. Since the output of G2 changes from 0 to 1 (thereby changing the output of G1/G2/G3) when C changes to 1 and either A or B changes to a 1, the sum of the increments assigned to A and C must equal 1. Since a change in both A and B, without an accompanying change in C, will not cause the output of G1/G2/G3 to change, it is necessary that the sum of the increments assigned to A and B be less than 1. This implies that the increment assigned to C must be greater than the increments assigned to A and B. To achieve these requirements, an increment of 0.25 is assigned to both A and B, while an increment of 0.75 is assigned to C. Using similar principles, the increments assigned to the inputs of the collapsed gate G1/G2/G3/G4 in FIG. 15 are A->0.125, B->0.125, C->0.25, D->0.75, E->1. As with the two level collapsed gate, the output changes value only when the gate count changes from a value less than one to a value greater than or equal to one, or vice versa.

The second method of collapsing heterogeneous connections is the layered method. The layered method allows arbitrary collapsing of heterogeneous connections, as illustrated in FIG. 16, but requires more computation in the simulation phase.

Figure 16:
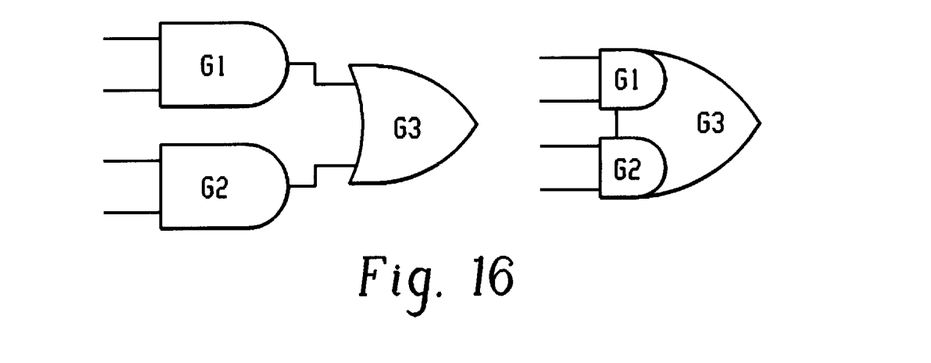
FIG. 16 is a schematic illustration of layered collapsing of connections, for a simulation system according to the present invention.

FIG. 16. Layered Collapsing of Connections

Unlike the linear technique, which uses a single count for each gate, the layered technique preserves the gate-counts of each of the original gates. The same number of tests are required as in would be necessary with the uncollapsed connections, but the tests are done simultaneously in a hierarchical fashion without any intermediate scheduling. To illustrate, assume that the top input of the G1/G2/G3 collapsed gate of FIG. 16 changes from 0 to 1. The count of G1 is decremented, and if the new value is not zero, no further processing is done. However if the new value is equal to zero, then the gate count of G3 is incremented. If the new gate count of G3 is 1, then the fanout branches of G3 are scheduled. No scheduling is done for the fanout branches of G1 or G2. The shadow for a layered connection differs from that of a simple connection in that the "Lock" component of the shadow is an array of pointers rather than a single pointer. The code for a two-level layered connection corresponds to the increment processor of a simple connection. As for simple connections, the increment and decrement processors alternate with one another.

---

INCREMENT Routine for Two-Level Connections

```
INCREMENT_LAYERED_1:
Current_Shadow—>subroutine = &DECREMENT_LAYERED_2;
(*Current_Shadow—>Lock[1])++;
if ((*Current_Shadow—>Lock[1]) == 1)
{
    (*Current_Shadow—>Lock[0])--;
    if ((*Current_Shadow—>Lock[0]) == 0)
    {
        if (fanouts not on queue)
        {
            insert fanouts into queue;
        }
        else
        {
            remove fanouts from queue;
        }
    }
}
Current_Shadow = Current_Shadow—>next;
Goto *Current_Shadow—>subroutine;
```

---

4. Performance Evaluation

Four prototypes were constructed to test the principles of the present invention presented in the previous sections. The first contains no optimizations other than block scheduling of fanout branches. The second provides for elimination of NOT and BUFFER gates. The third provides for the elimination of homogeneous connections in addition to the elimination of NOT and BUFFER gates. The fourth provides for elimination of both heterogeneous and homogeneous connections, as well as elimination of NOT and BUFFER gates. The fourth prototype uses the layered method for eliminating heterogeneous connections. All prototypes are levelized event-driven zero-delay simulators based on the LECSIM model.

The prototypes were certified to produce correct results by running them on the ISCAS-85 benchmarks, which have become a standard for measuring the performance of gate-level simulations. Each circuit was simulated with 5000 randomly generated input vectors, and the outputs were compared to those of the FHDL simulator, a levelized compiled code simulator that has been in use for several years. These same circuits and randomly generated input vectors were used to evaluate the relative performance of the five simulators. For performance evaluation, each simulation was run five times on a SUN-4 IPC running SUNOS with 12 megabytes of memory and a dedicated disk drive. This system was isolated from outside influences as much as possible during the execution of the tests. Each simulation was done three different ways. First, a complete simulation was done with full input and output. Second, the output functions of the simulators were disabled but the simulators still performed all input and simulation functions. Third, both the simulation functions and the output functions were disabled, leaving only the input functions. Each of these simulations was performed five times and the results were averaged to minimize errors in the UNIX/bin/time command, which was used to report the timings. The "user" field from the output of the /bin/time command was used to determine the execution time. Finally, the results of the read-only simulations was subtracted from the results of the no-print simulations to obtain the final results reported in Table 1 below. This procedure was used to report simulation times exclusive of the time required to read input vectors and print results. All simulations were run as compiled code simulations. The C language was used as the target language for all of the simulators.

TABLE 1

Experimental Results.

| Circuit | Unop. | NOT Elim. | Hom. Elim. | Hom./Het. Elim. | LCC | Activity |
|---------|-------|-----------|------------|-----------------|------|----------|
| c432    | 1.7   | 1.6       | 1.4        | 1.2             | 0.5  | 59.4     |
| c499    | 2.0   | 1.9       | 1.9        | 1.9             | 0.6  | 63.2     |
| c880    | 3.8   | 3.5       | 3.2        | 2.7             | 1.2  | 57.1     |
| c1355   | 6.5   | 5.4       | 5.4        | 4.2             | 1.9  | 56.5     |
| c1908   | 8.1   | 5.8       | 5.6        | 4.5             | 4.4  | 56.8     |
| c2670   | 17.7  | 13.2      | 12.2       | 11.7            | 5.3  | 55.7     |
| c3540   | 16.5  | 11.6      | 10.0       | 9.3             | 8.4  | 52.4     |
| c5315   | 36.9  | 28.8      | 28.1       | 22.8            | 21.7 | 63.8     |
| c6288   | 40.4  | 40.0      | 39.7       | 33.8            | 30.1 | 61.5     |
| c7552   | 52.6  | 40.6      | 39.4       | 33.5            | 40.7 | 60.7     |

As Table 1 indicates, the activity rates of the circuits tested ranged from just over 50% to over 60%. At this level of activity, Levelized Complied Code simulation (the LCC column) typically outperforms event driven simulation by a significant margin. However, for the simulator according to the present invention with deletion of Homogeneous and Heterogeneous connections, the timings are essentially the same for the circuits c1908, c3540, c5315, and c6288. For circuit c7552, the Inversion Algorithm actually outperforms Levelized Compiled Code simulation.

I. Conclusion

As the results of the previous section indicate, the simulator of the present invention is competitive with Levelized Compiled Code simulation, even at very high activity rates. However, as described above, the simulator of the present invention is an event-driven simulation technique. This implies that any reduction in the activity rate will cause a proportional reduction in execution time. Since the activity rates reported here are probably significantly higher than those that would be encountered in practice, it is believed the simulator of the present invention will probably outperform Levelized Compiled Code simulation in most practical situations.

There are additional features of a simulator of the present invention that make it an attractive alternative to Levelized Code Simulation. Because a simulator according to the present invention can be run interpretively, one can use it for fast debugging of circuits during the initial phases of the design cycle, and still retain the performance benefits. Furthermore, because of the small size of the run-time code, a simulator according to the present invention could be quite beneficial to developers who must support multiple platforms. For Levelized Compiled Code simulation to perform at optimum efficiency it is usually necessary to generate code at the assembly language level. However this can cause difficulties in porting simulators from one platform to another. Because of the small size of the run-time code for a simulator according to the present invention, it would be feasible to write this code in assembly language for several different platforms, and simply load the routines from a library during the simulation phase.

Thus, a simulator has been described above which is believed to provide an effective tool for the design and verification of complex digital circuits. With the foregoing description in mind, it is believed that further development of simulators using the principles of the present invention will become apparent to those skilled in the art.

I claim:

1. An event driven system for simulating an electric circuit, comprising:
    (a) means for generating a machine readable circuit description, which includes gates and the gate arrangements for the circuit;
    (b) translation means for creating data structures suitable for simulation of the circuit; and
    (c) simulation means for creating a program which schedules the simulation of only those gates and gate arrangements of the circuit whose outputs will change value during the simulation; and
    wherein said translation means includes:
        (a) means for removing all NOT gates from the circuit, and
        (b) means for collapsing all homogeneous connections in the circuit.

2. A system as defined in claim 1, wherein said simulation means uses only inversions of output signals from individual gates or gate arrangements to perform the simulation of the circuit.

3. A system as defined in claim 2 wherein said translation means further includes means for collapsing at least one heterogeneous connection in the circuit.

4. A system as defined in claim 1, wherein said translation means further includes means for collapsing at least one heterogeneous connection in the circuit.

5. A method of simulating an electric circuit having connections between logical gates and gate arrangements, said method comprising the steps of:
    (a) classifying connections between any two of the group consisting of AND, NAND, OR, and NOR gates as either homogeneous connections or heterogeneous connections;
    said homogeneous connections being characterized as a connection between two AND gates, between two OR gates, from an AND gate to a NAND gate, from an OR gate to a NOR gate, from a NAND gate to an OR gate, from a NAND gate to a NOR gate, from a NOR gate to an AND gate, or from a NOR gate to a NAND gate, and said heterogeneous connections being characterized as a connection between two NAND gates, between two NOR gates, from an AND gate to an OR gate, from an AND gate to a NOR gate, from an OR gate to an AND gate, from an OR gate to a NAND gate, from a NAND gate to an AND gate, or from a NOR gate to an OR gate;
    (b) removing all NOT gates from the circuit;
    (c) collapsing all homogeneous connections that do not fan out to more than one gate, including at least one connection from a NAND gate to an OR gate, from a NAND gate to a NOR gate, from a NOR gate to an AND gate, or from a NOR gate to a NAND gate; and
    (d) collapsing at least one of said heterogeneous connections.

6. A method of simulating an electric circuit according to claim 5 further comprising the step of scheduling the simulation of only those gates and gate arrangements of the circuit whose outputs will change value during the simulation.

7. A method of simulating an electric circuit according to claim 5 further comprising the step of creating multi-level collapsed connections.

8. A method of simulating an electric circuit according to claim 5 further comprising the step of collapsing at least one heterogeneous connection that does not fan out to more than one gate.

9. A method of simulating an electric circuit according to claim 5 further comprising the step of eliminating all net values, except those net values that are visible to a user.

10. A method of simulating an electric circuit according to claim 9 further comprising the step of simulating gates only by inverting their output either from a logical ONE to a logical ZERO or from a logical ZERO to a logical ONE.

11. A method of simulating an electric circuit according to claim 5 further comprising the step of simulating gates only by inverting their output either from a logical ONE to a logical ZERO or from a logical ZERO to a logical ONE.

12. A method of simulating an electric circuit according to claim 5 further comprising the step of block scheduling fanout branches.

13. A method of simulating an electric circuit according to claim 5 wherein said method has an event processing phase and a gate simulation phase and further comprises the step of executing a counting routine during the event processing phase rather than the gate simulation phase.

14. A method of simulating an electric circuit according to claim 5 wherein said method includes event driven processing and wherein an event corresponds to a change in a single fanout branch of a net.

15. A method of simulating an electric circuit having connections between logical gates and gate arrangements, wherein said method has an event processing phase, said method comprising the steps of:
    (a) classifying connections between any two of the group consisting of AND, NAND, OR, and NOR gates as either homogeneous connections or heterogeneous connections;
    said homogeneous connections being characterized as a connection between two AND gates, between two OR gates, from an AND gate to a NAND gate, from an OR gate to a NOR gate, from a NAND gate to an OR gate, from a NAND gate to a NOR gate, from a NOR gate to an AND gate, or from a NOR gate to a NAND gate; and said heterogeneous connections being characterized as a connection between two NAND gates, between two NOR gates, from an AND gate to an OR gate, from an AND gate to a NOR gate, from an OR gate to an AND gate, from an OR gate to a NAND gate, from a NAND gate to an AND gate, or from a NOR gate to an OR gate;

(b) removing all NOT gates from the circuit;

(c) collapsing all homogeneous connections that do not fan out to more than one gate, including at least one connection from a NAND gate to an OR gate, from a NAND gate to a NOR gate, from a NOR gate to an AND gate, or from a NOR gate to a NAND gate;

(d) collapsing at least one of said heterogeneous connections that do not fan out to more than one gate;

(e) creating multi-level collapsed connections;

(f) eliminating all net values, except those net values that are visible to a user;

(g) scheduling the simulation of only those gates and gate arrangements of the circuit whose outputs will change value during the simulation;

(h) simulating gates only by inverting their output either from a logical ONE to a logical ZERO or from a logical ZERO to a logical ONE;

(i) block scheduling fanout branches; and (j) executing a counting routine during the event processing phase rather than a gate simulation phase; and wherein said method includes event driven processing and wherein an event corresponds to a change in a single fanout branch of a net.

* * * * *